United States Patent [19]
Andrews

[11] Patent Number: 5,352,926
[45] Date of Patent: Oct. 4, 1994

[54] FLIP CHIP PACKAGE AND METHOD OF MAKING

[75] Inventor: James A. Andrews, Phoenix, Ariz.

[73] Assignee: Motorola, Inc., Schaumburg, Ill.

[21] Appl. No.: 80

[22] Filed: Jan. 4, 1993

[51] Int. Cl.⁵ .............................................. H01L 23/48
[52] U.S. Cl. .................................. 257/717; 257/737; 257/778; 437/209; 437/215
[58] Field of Search ............. 257/737, 747, 720, 778, 257/717, 778, 734; 437/195, 209, 215

[56] References Cited

U.S. PATENT DOCUMENTS

| | | | |
|---|---|---|---|
| 3,471,753 | 10/1969 | Burks et al. | 257/778 |
| 3,871,015 | 3/1975 | Lin et al. | 257/778 |
| 5,077,598 | 12/1991 | Bartelink | 357/68 |
| 5,250,847 | 10/1993 | Baskett | 257/778 |

FOREIGN PATENT DOCUMENTS 56-94781  7/1981  Japan.

Primary Examiner—William Mintel
Assistant Examiner—Roy Potter
Attorney, Agent, or Firm—Miriam Jackson

[57] ABSTRACT

A portion of a semiconductor die is rigidly flip chip bonded to a conductive base plate and portion is bonded to a flexible dielectric material to take advantage of the benefits of flip chip packaging while at the same time allowing for heat to be dissipated and for differential thermal expansion to be relieved. A semiconductor die having at least a first and a second bump formed thereon is rigidly connected to the base plate through the first bump and is flexibly connected to the base plate through the second bump.

19 Claims, 2 Drawing Sheets

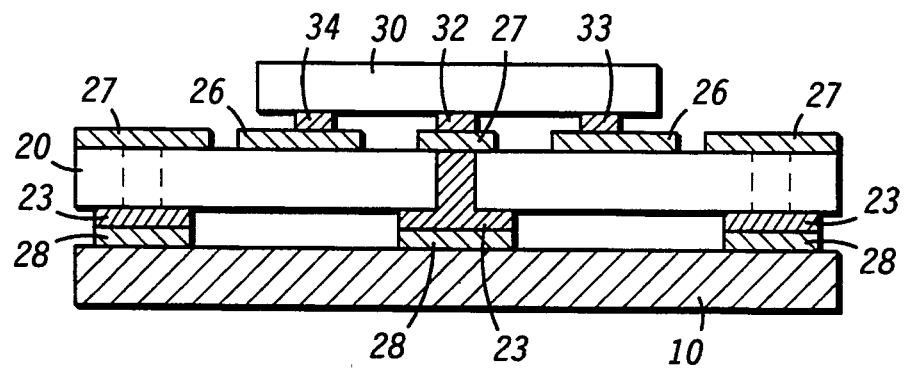
FIG. 1
FIG. 2
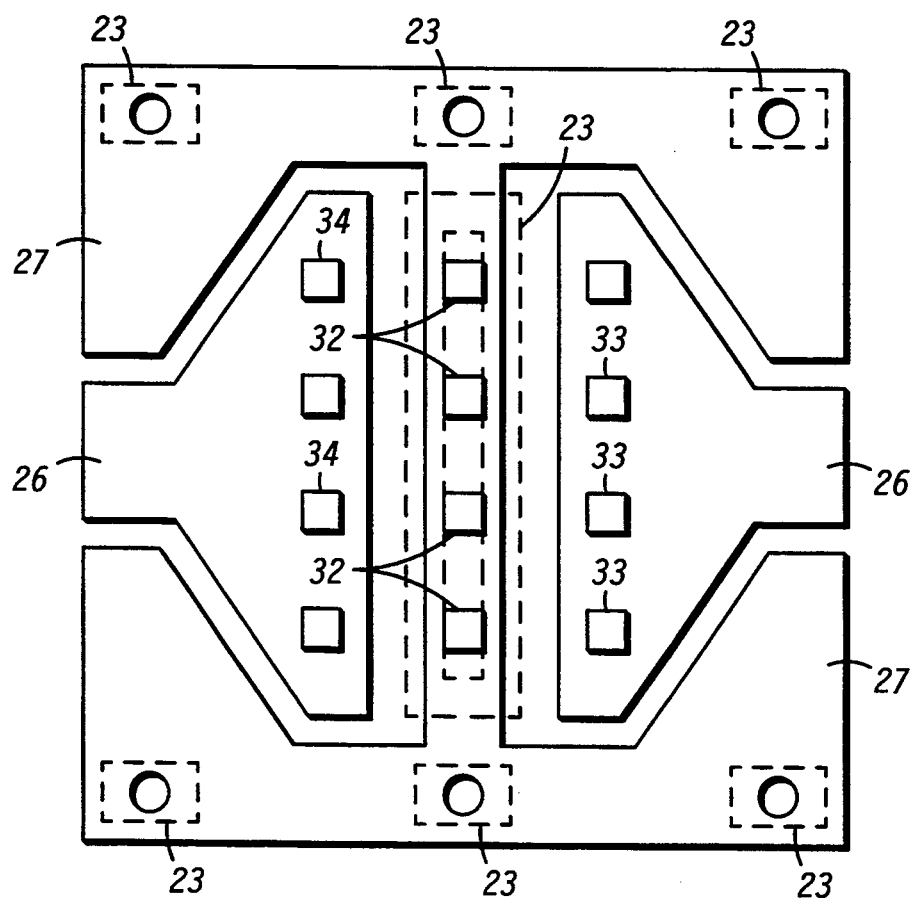

FLIP CHIP PACKAGE AND METHOD OF MAKING

BACKGROUND OF THE INVENTION

This invention relates, in general, to semiconductor packages, including, but not limited to, a flip chip package for semiconductor die.

Flip chip packaging has been used in the past to provide many advantages over wire bonding. Flip chip mounting involves directly mounting a semiconductor die having conductive bumps onto a rigid substrate carrier having conductive pads that mate with the conductive bumps. This is in contrast to wire bonding, where the chip is bonded to a rigid substrate and wires are bonded to conductive pads on the chip. Flip chip provides for shorter interconnection lengths which results in lower inductance. Flip chip also provides for elimination of wire bond which results in elimination of wire bonding steps. A smaller package footprint is also obtained with a flip chip package. Further, a lower profile chip mounting results because wire loops are eliminated.

One problem with flip chip packaging is that it is subject to mechanical strain at the point where the bumps and the rigid substrate are in contact due to the differential thermal expansion between the chip and the rigid substrate. One solution to this problem is to mount the chip onto a flexible membrane. The flexible membrane approach allows the chip to remain reliable during differential thermal expansion, however, the flexible membrane is not suitable for chips that need to dissipate a lot of heat. Chips that need to dissipate a substantial amount of heat (1 Watt) need to be attached to a heat sink, a thermally conductive layer. The flexible membrane does not have this characteristic, and thus does not act as a heatsink. Thus, a new packaging approach is needed which is suitable for chips that need to dissipate heat.

SUMMARY OF THE INVENTION

A semiconductor package is comprised of a base plate comprised of a thermally and electrically conductive material. A semiconductor die having at least a first and a second bump formed thereon is rigidly connected to the base plate through the first bump and is flexibly connected to the base plate through the second bump.

BRIEF DESCRIPTION OF THE DRAWINGS

FIG. 1 illustrates a cross-sectional view of a first embodiment of the present invention;

FIG. 2 illustrates a top view of the first embodiment of the preset invention;

DETAILED DESCRIPTION OF THE DRAWINGS

FIG. 1 illustrates an enlarged, cross-sectional view (not drawn to scale) of a first embodiment of the present invention. What is shown is a semiconductor die 30 bonded to a heat sink or base plate 10 and bonded to a flexible dielectric material 20. As will be shown, the flip chip package of the present invention takes advantage of the benefits of flip chip packaging while at the same time allowing for heat to be dissipated and for differential thermal expansion to be relieved.

Semiconductor die 30 is packaged as follows. Base plate 10 is provided. Base plate 10 is comprised of a thermally and electrically conductive material. In a preferred embodiment base plate 10 is comprised of copper, however, other metallization layers, such as aluminum, will work. Copper is preferable because it has a high thermal conductivity of approximately 2.6–3.9 Watts/cm-°C.; while aluminum has a lower thermal conductivity of approximately 2 Watts/cm-°C. Base plate 10 is preferably thick enough to allow for heat to be absorbed and dissipated. For a semiconductor die 30 dissipating approximately 1 Watt, a copper base plate 10 having a thickness of approximately 0.002 to 0.5 cm is desirable. A copper base plate 10 of this thickness is rigid, and thus the connection between base plate 10 and semiconductor die 30 is subject to high stress. A flexible connection is desirable to relieve some of that stress.

Figure 4:
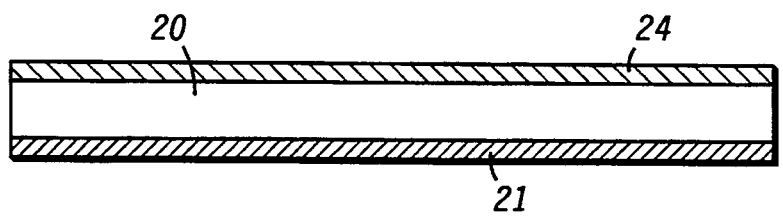
FIG. 4 illustrates a portion of the first or the second embodiment of the present invention in a beginning stage of fabrication.
Figure 5:
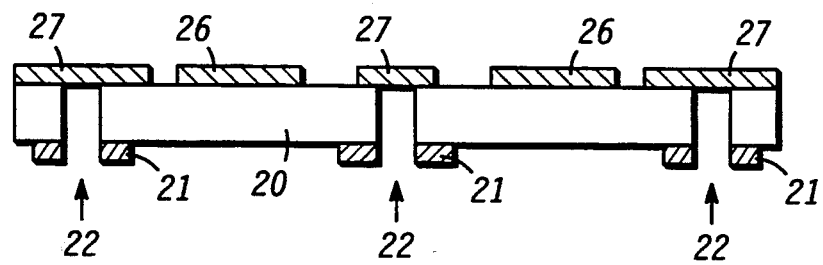
FIG. 5 illustrates the structure of FIG. 4 in a further stage of fabrication.
Figure 6:
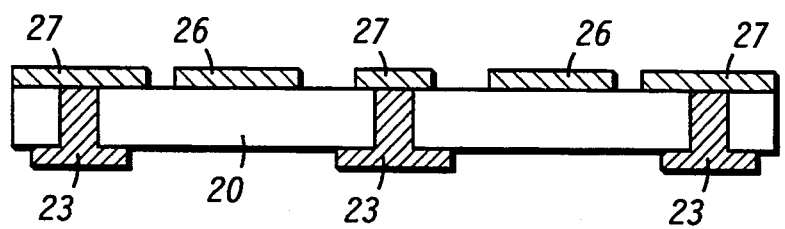
FIG. 6 illustrates the structure of FIG. 5 in a further stage of fabrication.

Flexible dielectric material 20 is prepared as shown in FIGS. 4–6. Flexible dielectric material 20 is comprised of any flexible dielectric material, typically an organic material such as polyimide. Flexible dielectric material 20 is laminated with a conductive layer 24 on a first surface and with a conductive layer 21 on a second surface as shown in FIG. 4. The structure shown in FIG. 4 is commercially available as a "flexible circuit" from various companies. In a preferred embodiment, conductive layer 24 and 21 are comprised of copper. Typically, a chrome or zinc layer is used to provide adhesion between copper and the organic material of flexible dielectric material 20.

FIG. 5 illustrates the structure of FIG. 4 further along in processing. A portion of conductive layer 24 is removed to provide a patterned conductive layer having at least two portions 26 and 27 which are separated from each other. A portion of conductive layer 21 is removed. The removal of portions of conductive layers 24 and 21 may be done at the same time. In this embodiment a standard copper etch may be used. Then, a portion of flexible membrane 20 is removed to provide at least one opening 22 to conductive layers 26 and 27. Note that conductive layer 21 surrounds openings 22.

FIG. 6 illustrates the structure of FIG. 5 further along in processing. At least one conductive region 23 is formed in at least one opening 22 of flexible dielectric material 20. This side view illustrates three conductive regions 23; further descriptions will refer to this embodiment. In the preferred embodiment, conductive regions 23 are comprised of copper, and may be formed by plating techniques well known in the art. Conductive regions, 23 make electrical contact to portions of conductive layers 26 and 27 on the first surface of flexible dielectric material 20. Because conductive regions 23 are preferably of the same material as portions of conductive layer 21 which were left remaining, portions of conductive layer 21 are shown as part of conductive regions 23 for illustrative convenience. In addition, other methods of forming conductive regions 23 are possible which would form conductive regions 23.

Referring back to FIG. 1, flexible dielectric material 20 as shown in FIG. 6 is bonded to base plate 10. In a preferred embodiment, bonding is accomplished by using a solder material 28. Solder material 28 is typically comprised of a lead-tin alloy. Next, a semiconductor die 30 is bonded to conductive layers 26 and 27 through bumps 32, 33, and 34. As an example, semiconductor die 30 is a gallium arsenide MESFET having bumps 32, 33, and 34 comprised of gold. Bumps 32, 33, and 34 may be comprised of other conductive materials, such as solder (lead-tin alloy) in certain applications, however, in power applications where a substantial amount of heat must be dissipated (approximately 1 Watt), solder is not preferable due to its thermal conductivity. The formation of bumps 32, 33, and 34, for flip chip bonding is well known in the art. Semiconductor die 30 may be bonded to conductive layers 26 and 27 by thermal compression bonding, thermosonic bonding, or a solder reflow method, where a small amount of solder is placed on the tips of bumps 32, 33, and 34.

In the example illustrated here, bump 32 makes electrical contact to, and therefore comprises, a source region of semiconductor die 30, bump 33 makes electrical to contact to, and therefore comprises, a drain region of semiconductor die 30 and bump 34 makes electrical contact to, and therefore comprises, a gate region of semiconductor die 30. Each bump 32, 33, and 34 may also be comprised of a plurality of bumps. In this example, the majority of the heat from semiconductor die 30 is dissipated in a central region of semiconductor die 30, which is the location of bump 32, therefore, bump 32 is bonded to a portion of conductive layer 27 directly over at least a portion of one conductive region 23. In this example, the source region (bump 32) of semiconductor die 30, is typically grounded in normal use, therefore it is attached to base plate 10, which is typically grounded because base plate 10 forms one face of an electrically shielded case.

More preferably, bump 32 is bonded so that it is directly over a conductive region 23 to allow for maximum heat transfer from semiconductor die 30 to base plate 10. The connection at bump 32 is mechanically rigid. To take advantage of flexible dielectric material 20, bumps 33 and 34 are bonded to a portion of conductive layer 26 which is over flexible membrane 20, not over a portion of conductive region 23. Semiconductor die 30 is thus rigidly connected to the base plate through bump 32 and is flexibly connected to the base plate through bumps 33 and 34. The two conductive regions 23 shown which do not provide for direct, mechanical contact to a bump 32, 33, or 34 of semiconductor die 30 keep the first surface of flexible dielectric material 20 planar so that an air gap is provided between a portion of flexible dielectric material 20 and base plate 10 to allow flexible dielectric material to move and relieve stresses. Conductive regions 23 also provide for further locations of electrical contact to a portion of conductive layer 27. As can be seen, base plate 10 allows for heat dissipation and flexible membrane 20 allows for flexibility to reduce the strain at bumps 33 and 34 and at semiconductor die 30 due to differential thermal expansion between semiconductor die 30 and conductive layers 26 and 27 and conductive regions 23 formed on flexible dielectric material 20 and between semiconductor die 30 and base plate 10. A high thermal conductivity path between bumps 33 and base plate 10 is formed by conductive region 23 and a portion of conductive layer 27.

FIG. 2 illustrates a top view of the embodiment of the present invention. FIG. 2 better illustrates how conductive layer 24 may be patterned on the first surface of flexible dielectric material 20 to form separated conductive layers 26 and 27. In this embodiment, conductive layers 26 are patterned to provide separate electrical contact to the drain (bump 33), and gate (bump 34) of semiconductor die 30. Conductive layer 27 is patterned so that separate electrical contact is made to the source (bump 32) of semiconductor die 30. Other patterns are obviously possible. Conductive regions 23 are shown to make electrical contact to a portion of conductive layer 27 at several locations.

Figure 3:
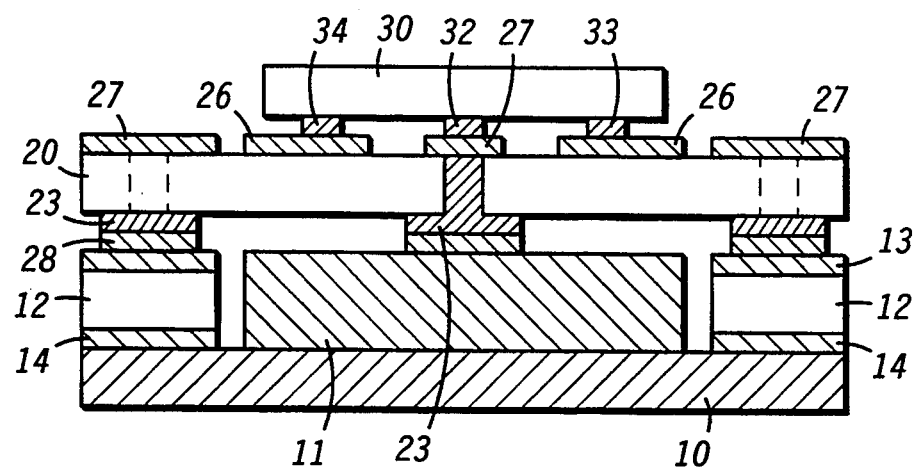
FIG. 3 illustrates a cross-sectional view of a second embodiment of the present invention.

FIG. 3 illustrates an enlarged side view of a second embodiment of the present invention. The same elements as shown in FIG. 1 are numbered the same as in FIG. 1 and are not further described. The difference between the second embodiment and the first embodiment is that in this embodiment, a conductive slug 11 is positioned between base plate 10 and conductive region 23 which is rigidly attached to bump 33. Conductive slug 11 is preferably comprised of copper. In addition, an insulating material 12 is positioned between conductive regions 23 and base plate 10. insulating material 12 is sandwiched between two conductive layers 13 and 14, which are preferably comprised of copper. This embodiment is used when it is necessary to absorb more transient heat. Conductive slug 11 provides a greater mass through which heat is absorbed and dissipated. For applications where only approximately 1 Watt of heat is dissipated, the first embodiment is preferable because it provides for a lower profile package and weighs less than the package of the second embodiment.

Thus, the present invention combines a high heat transfer capability with mechanically low stress electrical connections. All of the advantages of a flip chip package are also obtained. A flip chip bonded semiconductor die 30 has a shorter heat path length than a wire bonded die. In addition, a wire bonded, die bonded, gallium arsenide die has to be thinned in order to dissipate the heat because the die is attached to a heatsink by a surface opposite to that at which the heat is generated. This thinning process can result in a high yield loss. The present invention avoids the need to thin the die because heat is removed from the same face of the die where the heat is generated.

I claim:

1. A semiconductor package, comprising:
   a base plate comprised of a thermally and electrically conductive material; and
   a semiconductor die having at least a first and a second bump formed thereon, wherein the semiconductor die is rigidly connected to the base plate through the first bump and is flexibly connected to the base plate through the second bump by way of a flexible dielectric material which is disposed on a portion of the base plate.

2. The semiconductor package of claim 1 wherein an air gap is formed between at least a portion of the flexible dielectric material and the base plate.

3. The semiconductor package of claim 1, wherein the base plate is comprised of copper.

4. The semiconductor package of claim 1, wherein the first bump is electrically connected to a source of the semiconductor die.

5. The semiconductor package of claim 1, wherein the first bump is electrically connected to a heat dissipating area of the semiconductor die.

6. A semiconductor package, comprising:

a base plate comprised of a thermally and electrically conductive material;

a flexible material having a first surface and a second surface attached to the base plate at least a first conductive layer disposed on a portion of the second surface of the flexible material and in between portions of the flexible material;

a third and a fourth conductive layer disposed on a portion of the first surface of the flexible material, wherein the third and the fourth conductive layers are separated from each other and the third conductive layer is electrically connected to the first conductive layer; and a semiconductor die having at least a first and a second bump formed thereon, wherein the first bump is disposed on the third conductive layer over at least a portion of the first conductive layer, and the second bump is disposed on the fourth conductive layer which is over the flexible material.

7. The semiconductor package of claim 6, further comprising a conductive slug disposed between the first conductive layer and the base plate, and an insulating material formed between two fifth conductive layers disposed between the fourth conductive layer and the base plate.

8. The semiconductor package of claim 6, wherein the base plate is comprised of copper.

9. The semiconductor package of claim 6, wherein the first, second, third, and fourth conductive layers are comprised of copper.

10. The semiconductor package of claim 6, wherein the first and the second bump are comprised of gold.

11. The semiconductor package of claim 6, wherein the first bump is electrically connected to a source of the semiconductor die.

12. The semiconductor package of claim 6, wherein the first bump is electrically connected to a heat dissipating area of the semiconductor die.

13. The semiconductor package of claim 6 wherein an air gap is formed between at least a portion of the flexible material and the base plate.

14. A method of fabricating a semiconductor package, comprising the steps of:
providing a base plate comprised of a thermally and electrically conductive material;
providing a semiconductor die having at least a first and a second bump formed thereon;
rigidly connecting the semiconductor die to the base plate through the first bump; and
flexibly connecting the semiconductor die to the base plate through the second bump by way of a flexible dielectric material which is disposed on a portion of the base plate.

15. The method of claim 14 wherein the step of flexibly connecting the semiconductor die to the base plate further comprises forming an air gap between at least a portion of the flexible dielectric material and the base plate.

16. The method of claim 14 wherein the step of providing a base plate further comprises providing a base plate comprised of copper.

17. The method of claim 14 further comprising the step of electrically connecting the first bump to a source of the semiconductor die.

18. The method of claim 14 further comprising the step of electrically connecting the first bump to a heat dissipating area of the semiconductor die.

19. A semiconductor package, comprising:
a base plate comprised of a thermally and electrically conductive material; and
a semiconductor die having at least a first and a second bump formed thereon, wherein the semiconductor die is rigidly connected to the base plate through the first bump and wherein the first bump is electrically connected to a heat dissipating area of the semiconductor die and further wherein the semiconductor die is flexibly connected to the base plate through the second bump.

* * * * *